United States Patent [19]

Hummel

[11] Patent Number: 4,594,515
[45] Date of Patent: Jun. 10, 1986

[54] SWITCHING CIRCUIT
[75] Inventor: Roger L. Hummel, El Paso, Tex.
[73] Assignee: Universal Metal Industries, Phoenix, Ariz.
[21] Appl. No.: 619,718
[22] Filed: Jun. 11, 1984
[51] Int. Cl.[4] .................... H03K 17/72; H03K 17/969
[52] U.S. Cl. .................................. 307/252 B; 307/38; 307/157; 307/241
[58] Field of Search ..................... 307/241, 252 B, 30, 307/38, 40, 115, 155, 157, 440, 463; 328/70, 71

[56] References Cited

U.S. PATENT DOCUMENTS 4,287,939 9/1981 Pohl et al. ............................ 307/155
4,361,798 11/1982 Tolmie, Jr. .......................... 307/311

Primary Examiner—John Zazworsky
Attorney, Agent, or Firm—Don J. Flickinger; Jordan M. Meschkow

[57] ABSTRACT

A switching circuit for controlling the lamp and fan speed on a common household vent hood includes first, second and third flip-flops, the outputs of which are optically coupled to first, second and third triacs. When each of the flip-flops have a specified output (high or low), its associated triac will be triggered so as to provide AC power to its respective load (lamp, low-speed fan and high-speed fan). Not only are each of the logic means optically isolated from the AC power being supplied to the load, but that portion of the circuit which generates DC voltages required by the remainder of the circuit is transformer coupled to a source of AC power. Thus, the user is afforded complete safety when using the switching circuit.

16 Claims, 2 Drawing Figures

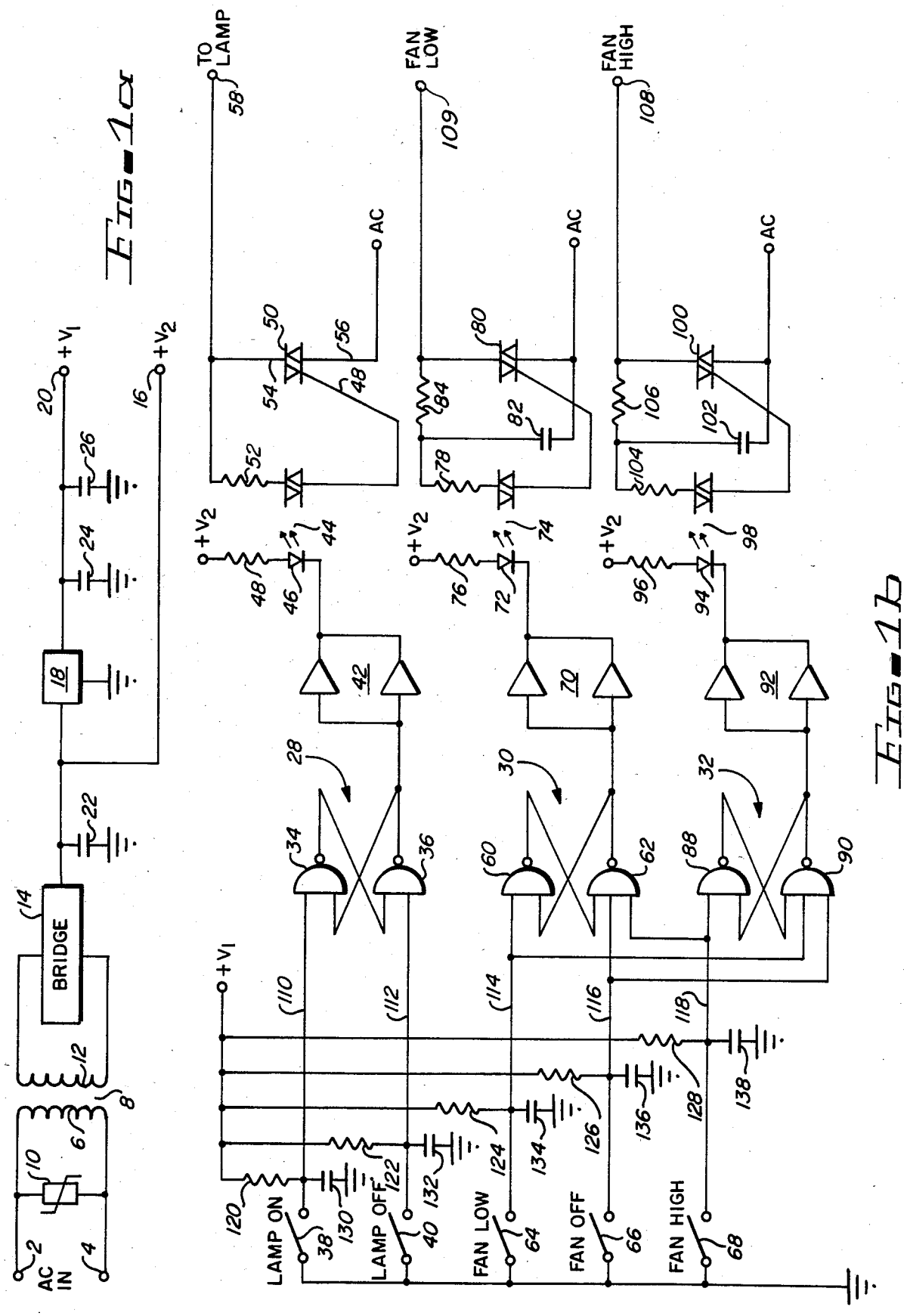

SWITCHING CIRCUIT

BACKGROUND OF THE INVENTION

1. Field of the Invention

This invention relates generally to switching circuits and, more particularly, to a digital switching circuit for providing control of a load or loads coupled thereto in response to selective input signals.

2. Prior Art

There are many applications where a switching circuit allows a user to control the operation of a load. For instance, many households utilize two-speed alternating current electric motors for performing different tasks. For example, many of today's cooking stoves have associated therewith a venting hood positioned over the range top. This venting hood usually includes a lamp and a two-speed AC motor for driving a fan so as to vent steam and cooking odors to the outside atmosphere. Typically, the motor speed or RPM is controlled by a single push-button switch built into the hood which is depressed by the user to control the connection of the motor windings so as to vary the speed of the motor. Most, if not all, of these type of switches utilized today require the user to sequence the operation of the motor in a predetermined manner. Thus, the motor can only be switched from an "off" mode of operation to a first speed of operation by manually closing a set of switch contacts. To switch the motor to a second speed of operation, the switch must again be closed. Finally, the motor is turned off by manually depressing the switch a third time. Thus, it is not possible for the user to directly select the speed of operation of the motor between a low or high speed from an "off" mode without first switching the motor to the first speed and then switching it to the second speed. Moreover, if the motor is running at the first speed, the user cannot directly turn the motor off but must first switch the motor to the second speed and then depress the switch again to turn the motor off. This type of sequential switching is undesirable.

Thus, there is a need for a compact switching unit which can provide multiple output signals for controlling the connection of a plurality of appliances to control the operation thereof and which permits the user to directly select a desired mode of operation.

SUMMARY OF THE INVENTION

Accordingly, it is an object of the present invention to provide an improved digital switching circuit for controlling the connections of the load coupled thereto so as to control operation of the load.

Still another object of the present invention is to provide an improved switching circuit which allows a user to selectively and directly control the connections of a load coupled thereto.

Yet another object of the present invention is to provide an improved switching circuit for use in conjunction with a multiple speed motor which allows a user to directly select the speed of the motor.

A still further object of the present invention is to provide an improved digital control circuit for use in conjunction with the lamp and fan of a range hood.

Yet another object of the present invention is to provide an improved digital switching circuit for use in conjunction with the hood lamp and fan of a stove venting hood which completely isolates the user from high currents or voltages.

According to a broad aspect of the invention there is provided a switching circuit having a plurality of inputs each capable of assuming first and second logic states and a plurality of outputs responsive to the respective states of the plurality of inputs, each of the outputs for controlling the application of a source of power to a load. The circuit includes first, second and third logic means. The first logic means has a first output capable of assuming first and second states and has first and second inputs, each also capable of assuming first and second states. This first output assumes the first state when the first input is in the first state and the second input is in the second state. The output assumes the second state when the first input is in the first or second state and the second input is in the first state. The second logic means has a second output also capable of assuming first and second states and has third, fourth and fifth inputs, each also capable of assuming first and second states. The second output assumes the first state when the third input is in the first state and the fourth and fifth inputs are in the second state. This second output assumes the second state when the third input is in the first or second state and at least one of the fourth and fifth inputs is in the first state. The third logic means has a third output capable of assuming first and second states and has the third, fourth and fifth inputs coupled thereto. The third output assumes the first state when the fifth input is in the first state and the third and fourth inputs are in the second state. The third output assumes the second state when the fifth input is in the first or second state and at least one of the third and fourth inputs is in the first state.

The circuit also includes first, second and third semiconductor switching means each for switching its respective load between an infinite impedance and the source of power, the first, second and third semiconductor switching means are optically coupled to the outputs of the first, second and third logic means. In addition, the DC voltages necessary for driving the circuit are generated by a bridge rectifier circuit and a voltage regulator circuit which are transformer coupled to a source of AC power. The front end transformer coupling and the back end optical coupling assure complete safely to the user of the appliances (e.g. the lamp and fan of a vent hood).

The above and other objects, features and advantages of the present invention will be more clearly understood from the following detailed description taken in conjunction with the accompanying drawings, in which:

BRIEF DESCRIPTION OF THE DRAWINGS

FIGS. 1A and 1B are schematic diagrams of the inventive switching circuit.

DESCRIPTION OF THE PREFERRED EMBODIMENT

FIG. 1A is a part schematic, part functional diagram of a circuit for generating DC supply voltage (+V1 and +V2) which are used by the remainder of the switching circuit. Input terminals 2 and 4 are coupled across a source of AC power (AC IN) and to opposite terminals of a primary winding 6 of a transformer 8. A surge supressor 10 (for example, a V130LA1 available from General Electric) is also coupled across terminals 2 and 4. The secondary terminal 12 of transformer 8 is coupled across a bridge rectifier circuit 14 (for example four 1N4004GP diodes available from General Instrument). The output of bridge circuit 14 (+V2) is made available at terminal 16 for use in the remainder of the circuit and is also supplied to the input of a voltage regulator 18 (e.g. a 78M05 available from Motorola). The output of voltage regulator 18 (+V1) is made available at terminal 20 for use in the remainder of the circuit. Capacitor 22 (e.g. 330 microfarads) is coupled between ground and the output of bridge circuit 14 to provide for noise suppression. Similarly, capacitors 24 and 26 coupled between ground and the output of voltage regulator 18 (each for example 0.1 microfarads) similarly provide for noise suppression. Voltages +V1 and +V2 are typically 5 volts and 10-20 volts, respectively.

Referring now to FIG. 1B, there is shown a switching circuit which includes first, second and third logic means 28, 30, and 32, respectively. The first logic means 28 includes an asynchronous flip-flop comprised of first and second NAND gates 34 and 36 each having an output fed back to a first input of the other. The second input of NAND gate 34 is coupled to a momentary switch 38 which, when depressed, indicates that a user desires to turn the lamp of a vent hood on. Similarly, the second input of NAND gate 36 is coupled to momentary switch 40 which, when depressed by a user indicates that the user wishes to turn the lamp off.

The output of NAND gate 36 is coupled to the inputs of buffer drivers 42 (e.g. a 7407 available from Signetics) which provide a complete current path to ground only when the output of NAND gate 36 is at a logical low level. The outputs of buffer drivers 42 are coupled to the cathode of infrared emitting diode 46 having an anode coupled to +V2 via resistor 48 (e.g. 330 ohms). Diode 46 represents a portion of an optical isolator 44 (e.g. a H11J5 available from General Electric). The optical isolator 44 is also coupled between the gate electrode 48 of a triac 50 (e.g. a Q2006L4 available from Teccor) and resistor 52. Triac 50 has a first input 54 coupled to the opposite end of resistor 52 and a second input 56 coupled to a source of AC power.

When momentary switch 38 is depressed, indicating that a user wishes to turn on the lamp, a logical low is applied to the input of NAND gate 34 causing its output to go high. Since switch 40 is open, the first and second inputs of NAND gate 36 will both be high causing a low to appear at the output of NAND gate 36. As explained previously, buffer drivers 42 will produce a complete current path when the output of 36 is low and therefore current will flow from plus V2 through resistor 48 and infrared emitting diode 46. Due to the optical coupling, current will flow through resistor 52 and gate 48 triggering triac 50. When triac 50 is triggered, AC power will be supplied through triac 50 to terminal 58 which is connected to the lamp circuit.

If it is now desired to turn the lamp off, the user merely momentarily depresses switch 40 causing the input of NAND gate 36 coupled to switch 42 to go low and producing a high at the output of NAND gate 36. This will cause buffer drivers 42 to break the current path, and no current will flow through infrared emitting diode 46. As a result, triac 50 will not be triggered and AC power will not be supplied to terminal 58.

The second logic means 30 includes a second asynchronous flip-flop comprised of NAND gates 60 and 62. As can be seen, a first input of NAND gate 60 is coupled to momentary switch 64 (fan low). The second input of NAND gate 60 is coupled to the output of NAND gate 62. A first input of NAND gate 62 is coupled to momentary switch 66 (fan off), a second input of NAND gate 62 is coupled to momentary switch 68 (fan high) and a third input of NAND gate 62 is coupled to the output of NAND gate 60. The remainder of the circuit includes buffer drivers 70 coupled to the output of NAND gate 62, and an infrared emitting diode 72 which forms part of an optical coupler 74, a resistor 76 coupled between an anode of diode 72 and +V2, a resistor 78, triac 80, capacitor 82, and resistor 84.

If either switch 66 (fan off) or switch 68 (fan high) is closed, a low input will be applied to NAND gate 62 causing its output to go high. As was the case previously in connection with the first logic means, a high output at NAND gate 62 will cause buffer drivers 70 to open. The remainder of the circuit operates as previously described. That is, if buffer drivers 70 are open, no AC power is applied through triac 80 to terminal 86. The only difference between this output circuit and the one previously described resides in the addition of resistor 84 and capacitor 82 which are provided as connected to suppress false triggers by the fan load in its run down mode. If switch 64 should be depressed, a low will be applied to an input of NAND gate 60 causing its output to go high. In this case, the inputs of NAND gate 62 will all be high causing a low at the output of NAND gate 62 which results in buffer driver 70 completing a current path. In this case, AC power will be supplied through triac 80 to terminal 86 in the manner previously described in connection with the first logic means 28.

Finally, the third logic means 32 includes a third asynchronous flip-flop comprised of first and second NAND gates 88 and 90, respectively. NAND gate 88 has a first input coupled to momentary switch 68 (fan high) and a second input coupled to the output of NAND gate 90. NAND gate 90 has a first input coupled to the output of NAND gate 88, a second input coupled to momentary switch 64 (fan low) and a third input coupled to momentary switch 66 (fan off). Thus, if either switch 64 or switch 66 is depressed, a high will appear at the output of NAND gate 90. The remainder of the circuit is identical to that previously described in connection with the second logic means and includes buffer drivers 92, an infrared emitting diode 94 which is part of an optical coupler 98, resistor 96 coupled between diode 94 and +V2, triac 100, capacitor 102, and resistors 104 and 106. Capacitor 102 has a typical value of 0.1 microfarads, and resistors 104 and 106 may each be 100 ohms. Thus, when the output of NAND gate 90 goes low, current flows through infrared emitting diode 94 causing triac 100 to be turned on and permitting AC power to be applied to terminal 108 (fan high).

As can be seen, input line 110 to NAND gate 34 has a resistor 120 (e.g. 10 Kohms) coupled between it and +V1 and a capacitor 130 (0.01 microfarads) coupled between it and the ground. Line 112 which is an input to NAND gate 36 has a resistor 122 (e.g. 47 Kohms) coupled between it and +V1 and a capacitor 132 (e.g. 0.1) microfarads coupled between it and the ground. Each of lines 114, 116, and 118 have similar resistor/capacitor combinations coupled thereto. Resistors 124 and 128 may by approximately 10 Kohms while resistor 126 may be 47 Kohms. Capacitors 134 and 138 may have a value of 0.01 microfarads while that of capacitor 136 is 0.1 microfarads. These values are chosen such that when the unit is first turned on, and as +V1 is rising to its nominal value (e.g. 5 volts) the voltages on lines 112 and 116 will rise more slowly than the voltages on lines 110, 114, and 118 thus presenting logical lows on lines 112 and 116 while presenting logical highs on lines 110, 114, and 118 thereby causing the outputs of NAND gates 36, 62, and 90 to be high. In these states, AC power will not flow to terminals 58, 86, or 108.

The above description is given by way of example only. Changes in form and details may be made by one skilled in the art without departing from the scope of the invention as defined by the appended claims.

I claim:

1. A switching circuit having a plurality of inputs each capable of assuming first and second logic states and a plurality of outputs responsive to the respective states of said plurality of inputs, each of said outputs for controlling the application of a source of power to a load, comprising:

first logic means having a first output capable of assuming first and second logic states and having first and second inputs each also capable of assuming first and second logic states, said first output assuming said first logic state when said first input is in said first logic state and said second input is in said second logic state, and assuming said second logic state when said first input is in said first or second logic state and said second input is in said first logic state;

second logic means having a second output capable of assuming first and second logic states and having third, fourth and fifth inputs each also capable of assuming first and second logic states, said second output assuming said first logic state when said third input is in said first logic state and said fourth and fifth inputs are in said second logic state, and for assuming said second logic state when said third input is in said first or second logic state and at least one of said fourth and fifth inputs is in said first logic state; and third logic means having a third output capable of assuming first and second logic states and having said third, fourth and fifth inputs, said third output assuming said first logic state when said fifth input is in said first logic state and said third and fourth inputs are in said second logic state, and assuming said second logic state when said fifth input is in said first or second logic state and at least one of said third and fourth inputs is in said first logic state.

2. A switching circuit according to claim 1 further comprising:

first, second and third semiconductor switch means; and first means optically coupled between said first, second and third outputs and said first, second and third semiconductor switch means, respectively, and responsive to the states of said first, second and third outputs for controlling said first, second and third semiconductor switch means.

3. A switching circuit according to claim 2 further comprising voltage generating means for deriving first and second DC voltages from AC source of supply, said voltage generating means comprising:

transformer means having a primary winding coupled to said AC source and having a secondary winding;

a bridge circuit coupled to said secondary winding for providing said first DC voltage which is applied to said first means; and voltage regulator means coupled to said bridge circuit for generating said second DC voltage for application to said first, second and third logic means.

4. A switching circuit according to claim 3 wherein said first logic means includes an asynchronous flip-flop comprised of first and second NAND gates, said first NAND gate having a first input terminal coupled to said first input and having a second input terminal coupled to said first output, and said second NAND gate having a first input terminal coupled to said second input and a second input terminal coupled to the output of said first NAND gate.

5. A switching circuit according to claim 4 wherein said second logic means includes an asynchronous flip-flop comprised of third and fourth NAND gates, said third NAND gate having a first input terminal coupled to said third input and a second input terminal coupled to said second output, and said fourth NAND gate having a first input terminal coupled to said fourth input, a second input terminal coupled to said fifth input and a third input terminal coupled to the output of said third NAND gate.

6. A switching circuit according to claim 5 wherein said third logic means includes an asynchronous flip-flop comprised of fifth and sixth NAND gates, said fifth NAND gate having a first input terminal coupled to said fifth input and having a second input terminal coupled to said third output, and said sixth NAND gate having a first input terminal coupled to said third input, a second input terminal coupled to said fourth input, and a third input terminal coupled to the output of said fifth NAND gate.

7. A switching circuit according to claim 6 wherein each of said first, second and third semiconductor switch means comprises a triac.

8. A switching circuit according to claim 7 wherein said first means comprises first, second and third optical isolators coupled between said first, second and third outputs and said first, second and third semiconductor switch means, respectively.

9. A switching circuit according to claim 8 further comprising first, second and third buffer driver circuits coupled between said first, second and third outputs and said first, second and third optical isolators, respectively.

10. A switching circuit for controlling the application of AC power to first and second appliances wherein first and second inputs correspond to ON and OFF states of said first appliance and wherein third, fourth and fifth inputs correspond to low speed, OFF and high speed states of said second appliance, each of said inputs capable of assuming first and second logic states, said switching circuit comprising:

first logic means having said first and second inputs and having a first output which assumes a first state when said first input in is said first state and said second input is in said second state and which assumes a second state when said first input is in said first state or second state and said second input is in said first state;

second logic means having said third, fourth and fifth inputs and having a second output which assumes said first state when said third input is in said first state and said fourth and fifth inputs are in said second state, and which assumes said second state when said third input is in said first or second state and at least one of said fourth and fifth inputs is in said first state;

third logic means having said third, fourth and fifth input and having a third output which assumes said first state when said fifth input is in said first state and said third and fourth inputs are in said second state, and which assumes said second state when said fifth input is in said first or second state and at least one of said third and fourth inputs is in said first state;

first, second and third semiconductor switch means for applying AC power to said first and second appliances;

first means for optically coupling said first, second and third semiconductor switch means to said first, second and third outputs, respectively; and transformer means coupled to said first, second and third logic means, said first, second and third semiconductor switch means and said first means for coupling said switching circuit to a source of said AC power.

11. A switching cicruit according to claim 10 wherein said first logic means includes a first asynchronous flip-flop comprised of first and second NAND gates, said first NAND gate having first input terminal coupled to said first input and a second input terminal coupled to said first output, and said second NAND gate having a first input terminal coupled to said second input and having a second input terminal coupled to the output of said first NAND gate.

12. A switching circuit according to claim 11 wherein said second logic means includes an asynchronous flip-flop comprising third and fourth NAND gates, said third NAND gate having a first input terminal coupled to said third input and a second input terminal coupled to the output of said fourth NAND gate, and said fourth NAND gate having a first input terminal coupled to said fourth input, a second input terminal coupled to said fifth input and a third input terminal coupled to the output of said third NAND gate.

13. A switching circuit according to claim 12 wherein said third logic means includes an asynchronous flip-flop comprised of fifth and sixth NAND gates, said fifth NAND gate having a first input terminal coupled to said fifth input and a second input terminal coupled to said third output, and said sixth NAND gate having a first input terminal coupled to said third input, a second input terminal coupled to said fourth input and a third input terminal coupled to the output of said fifth NAND gate.

14. A switching circuit according to claim 13 wherein each of said first, second and third semiconductor switch means is a triac.

15. A switching circuit according to claim 14 wherein said first means comprises first, second and third optical isolators coupled between said first, second and third outputs and said first, second and third semiconductor switch means, respectively.

16. A switching circuit according to claim 15 further comprising first, second and third buffer driver circuits coupled between said first, second and third outputs and said first, second and third optical isolators, respectively.

* * * * *